US012584038B2

(12) United States Patent
Bewersdorff-Sarlette et al.

(10) Patent No.: US 12,584,038 B2
(45) Date of Patent: Mar. 24, 2026

(54) COATING FOR AN OPTOELECTRONIC COMPONENT, METHOD FOR PRODUCING SUCH A COATING, AND OPTOELECTRONIC COMPONENT COMPRISING SUCH A COATING

(71) Applicant: Heliatek GmbH, Dresden (DE)

(72) Inventors: Ulrike Bewersdorff-Sarlette, Dresden (DE); Andre Weiss, Dresden (DE)

(73) Assignee: HELIATEK GMBH, Dresden (DE)

( * ) Notice: Subject to any disclaimer, the term of this patent is extended or adjusted under 35 U.S.C. 154(b) by 631 days.

(21) Appl. No.: 17/784,121

(22) PCT Filed: Dec. 11, 2020

(86) PCT No.: PCT/DE2020/101051
§ 371 (c)(1),
(2) Date: Jun. 10, 2022

(87) PCT Pub. No.: WO2022/048699
PCT Pub. Date: Mar. 10, 2022

(65) Prior Publication Data

US 2023/0081559 A1 Mar. 16, 2023

(30) Foreign Application Priority Data

Sep. 7, 2020 (DE) ..................... 10 2020 123 252.7

(51) Int. Cl.
*C09D 181/02* (2006.01)
*B29D 11/00* (2006.01)
(Continued)

(52) U.S. Cl.
CPC ...... *C09D 181/02* (2013.01); *B29D 11/00865* (2013.01); *C09D 179/04* (2013.01);
(Continued)

(58) Field of Classification Search
None
See application file for complete search history.

(56) References Cited

U.S. PATENT DOCUMENTS 10,854,836 B2 12/2020 Kim et al.
2006/0144277 A1 * 7/2006 MacPherson .......... H10K 71/40
101/488

(Continued)

FOREIGN PATENT DOCUMENTS

DE 102004014046 A1 9/2004
DE 102004024461 A1 12/2005

(Continued)

OTHER PUBLICATIONS

Machine Translation of KR 20170112054 (Year: 2017).*

*Primary Examiner* — Michael Forrest
(74) *Attorney, Agent, or Firm* — LEYDIG, VOIT & MAYER, LTD.

(57) ABSTRACT

A coating for planarization and stabilization of a laser-structured surface of an optoelectronic component, the optoelectronic component having a layer system including a first electrode, a second electrode, and at least one photoactive layer, wherein the at least one photoactive layer is disposed at least partly between the electrodes, and wherein the layer system is laser-structured, the coating including a polythiolene matrix, wherein the polythiolene matrix is formed by polymerization from at least one first monomer and one second monomer, wherein the first monomer is a polyfunctional thiol having at least three thiol groups, the second monomer is a polyfunctional alkene having at least two C—C double bonds, and the coating is disposed on the optoelectronic component and has at least partial direct contact with the layer system and/or diffusion contact with the layer system for at least the first monomer and/or the second monomer.

13 Claims, 7 Drawing Sheets

(51) Int. Cl.

| | |
|---|---|
| ***C09D 179/04*** | (2006.01) |
| ***G02B 1/04*** | (2006.01) |
| ***G02B 1/14*** | (2015.01) |
| ***H10K 30/88*** | (2023.01) |

(52) U.S. Cl.
CPC ................. *G02B 1/04* (2013.01); *G02B 1/14* (2015.01); *H10K 30/88* (2023.02)

(56) References Cited

U.S. PATENT DOCUMENTS

| | | | | |
|---|---|---|---|---|
| 2007/0090371 | A1 | 4/2007 | Drechsel et al. | |
| 2007/0295400 | A1 | 12/2007 | Brabec et al. | |
| 2009/0096136 | A1 | 4/2009 | Hawker et al. | |
| 2009/0217980 | A1 | 9/2009 | Pfeiffer et al. | |
| 2011/0115101 | A1 | 5/2011 | Knobloch et al. | |
| 2012/0193645 | A1 | 8/2012 | Krummacher et al. | |
| 2013/0092239 | A1 | 4/2013 | Mori | |
| 2013/0104968 | A1 | 5/2013 | Pfeiffer et al. | |
| 2014/0326312 | A1 | 11/2014 | Park | |
| 2015/0179973 | A1 * | 6/2015 | Young | H10K 50/844 438/26 |
| 2016/0362576 | A1 | 12/2016 | Asanuma et al. | |
| 2017/0094810 | A1 | 3/2017 | Aresta et al. | |
| 2017/0349707 | A1 | 12/2017 | Nees et al. | |
| 2018/0319944 | A1 | 11/2018 | Chen et al. | |
| 2021/0288112 | A1 * | 9/2021 | Heimke | H10K 71/162 |

FOREIGN PATENT DOCUMENTS

| | | | | | |
|---|---|---|---|---|---|
| DE | 102008026216 | B4 | | 7/2010 | |
| DE | 102009025123 | A1 | | 12/2010 | |
| DE | 102015116418 | A1 | | 3/2016 | |
| KR | 1020130041694 | A | | 4/2013 | |
| KR | 1020160135408 | A | | 11/2016 | |
| KR | 20170112054 | A | * | 10/2017 | B32B 27/286 |
| KR | 1020180016550 | A | | 2/2018 | |
| KR | 20180052797 | A | | 5/2018 | |
| KR | 1020200015433 | A | | 2/2020 | |
| WO | WO 2004083958 | A2 | | 9/2004 | |
| WO | WO 2006092134 | A1 | | 9/2006 | |
| WO | WO 2010139804 | A1 | | 12/2010 | |
| WO | WO 2011138021 | A2 | | 11/2011 | |
| WO | WO 2015029846 | A1 | | 3/2015 | |
| WO | WO 2016090395 | A1 | | 6/2016 | |
| WO | WO-2018055214 | A1 | * | 3/2018 | H01L 27/301 |

* cited by examiner

COATING FOR AN OPTOELECTRONIC COMPONENT, METHOD FOR PRODUCING SUCH A COATING, AND OPTOELECTRONIC COMPONENT COMPRISING SUCH A COATING

CROSS-REFERENCE TO PRIOR APPLICATIONS

This application is a U.S. National Phase application under 35 U.S.C. § 371 of International Application No. PCT/DE2020/101051, filed on Dec. 11, 2020, and claims benefit to German Patent Application No. DE 10 2020 123 252.7, filed on Sep. 7, 2020. The International Application was published in German on Mar. 10, 2020 as WO 2022/048699 A1 under PCT Article 21(2).

FIELD

The invention relates to a coating for planarization and stabilization of a laser-structured surface of an optoelectronic component, to a method of coating a surface of a laser-structured optoelectronic component with such a coating, to an optoelectronic component having such a coating, and to a use of such a coating as winding protection for an optoelectronic component. The invention in particular also relates to a protective layer, also referred to as winding protection, and to a method of applying such a protective layer in a roll-to-roll method for production of a semifinished product of an optoelectronic component that can be handled without damage.

BACKGROUND

Optoelectronic components, in particular photovoltaic elements, consist of a layer system comprising two electrodes that has been applied to a substrate, with one applied as base electrode to the substrate and the other as top electrode on the side remote from the substrate. Between the two electrodes is at least one photoactive layer, preferably an organic photoactive layer. In addition, there may be further layers disposed between the electrodes, for example transport layers. The optoelectronic components having an organic photoactive layer, organic optoelectronic components, may be produced, for example, by evaporating the materials, by printing polymers, or by processing from a liquid. The basic construction of organic optoelectronic components is disclosed, for example, in WO2004083958A2, WO2006092134A1, WO2010139804A1 or WO2011138021A2. The organic active layers may be formed from polymers or small molecules. Small molecules are in particular understood to mean nonpolymeric organic molecules having monodisperse molar masses between 100 and 2000 g/mol, which are in the solid phase under standard pressure (air pressure of our surrounding atmosphere) and at room temperature. More particularly, the small molecules are photoactive, "photoactive" being understood to mean that the molecules change their state of charge and/or state of polarization with input of light.

A photoactive layer in a layer system may comprise solely an acceptor absorber material or solely a donor absorber material or else a combination of multiple absorber materials of different types and/or the same type. In addition, it is possible to add materials to the absorber layers in order to improve the absorption properties. The layer system may consist not only of photoactive (absorber) layers. Instead, it is possible for the layer system also to include further layers, for example transport layers, preferably doped transport layers between individual photoactive (absorber) layers and between a photoactive (absorber) layer and the electrodes.

Organic optoelectronic components, in particular organic solar cells, consist of a sequence of thin layers with at least one photoactive layer, which are preferably applied by vapor deposition under reduced pressure or processed from a solution. The electrical connection can be effected via metal layers, transparent conductive oxides and/or transparent conductive polymers. The vacuum vapor deposition of the organic layers is especially advantageous in the case of production of multilayer solar cells, especially tandem or triple cells. The prior art discloses organic simple or tandem cells. DE102004014046A1 discloses a photoactive component, in particular a solar cell, consisting of organic layers of one or more pi, ni and/or pin diodes stacked one on top of another.

Organic optoelectronic components, in particular organic solar cells or organic photodetectors, show a significantly reduced lifetime as a result of direct contact with air, especially oxygen, and/or moisture, especially water, and therefore have to be adequately protected by a barrier layer and/or an encapsulation. Encapsulation can be executed by means of barrier films or by means of direct encapsulation. This can be implemented by known methods.

Photovoltaic elements are structured by means of laser processes. This method is used particularly in the roll-to-roll method, both for connection of individual solar cell strips on a module and for electrical separation of individual cells. One problem in the production of optoelectronic components with organic layers in the roll-to-roll method is that the substrates are divided from one another only by an electrical insulation, generally introduced by laser processes or lithographic/chemical or mechanical processes. The substrates are present on the roll and, for completion, both have to be separated from one another and adequately protected from outside environmental influences. Particularly in the laser structuring of the electrodes, this gives rise to bulges, called laser scribes, which can damage the module when the module is wound up without a covering layer. A problem here is that the already complete layer system has to be protected from moisture, solvents and/or mechanical stress between the operating steps, since the organic layer can otherwise be damaged. An additional factor is the usually low adhesion between photoactive layers and electrodes in the layer system, and therefore winding and unwinding of the continuous substrate together with the entire layer system can lead to damage to the optoelectronic components. Therefore, a protective layer is required for protection of the optoelectronic component. This ensures damage-free transfer into a downstream machine and lower sensitivity in further processing of the optoelectronic component, in which even contacts on both sides of the film are possible. In the prior art, a polymer film is applied as protective layer. However, a prefabricated film, without special measures, for example complex drying, has a high moisture content, which can lead to damage to the layer system; moreover, there is mechanical stress on the layer system. Other methods of forming an outer layer are likewise known.

DE 10 2008 026 216 B4 discloses a method of applying a varnish to electronic circuits. However, the method cannot be used for application directly to a layer system, especially to electrodes or photoactive layers of the layer system, since this damages the layer system by virtue of a solvent content of the varnish.

DE 10 2009 025 123 A1 discloses layers applied by the extrusion of a polymer from a slot die onto radiation-emitting devices. As a result of the relatively high temperatures that are required for melting of the polymer and the mechanical stress resulting from the extrusion operation, this method cannot be used in order to form a protective layer on a photoactive layer system.

DE 10 2004 024 461 A1 discloses the production of an organic component in a roll-to-roll method, wherein the active regions of the semiconductor layer are not exposed to unprotected solvents and/or solvent vapors at any time during the production process.

DE102015116418A1 discloses a protective layer and a method of applying the protective layer in a continuous roll-to-roll method for production of a semifinished version of organic electronic components, comprising a layer stack on a substrate film, wherein the protective layer protects the layer stack before and during the final production from environmental influences and damage caused by handling. This involves applying a protective layer material which is fluid, crosslinkable or curable at least temporarily in the phase of application and is compatible with the layer stack in fluid and solid phase and with the conditions during the roll-to-roll method, in such a way as to form a functional protective layer.

However, a disadvantage from the prior art is that such coatings cannot be applied directly to a photoactive layer system, especially electrodes or photoactive layers, since these are damaged. Furthermore, the known methods are especially not suitable for a roll-to-roll method for production of optoelectronic components; in particular, in the roll-to-roll method for production of large-area solar cells, simple coverage of the layer system is insufficient because this can give rise to short circuits.

SUMMARY

In an embodiment, the present invention provides a coating for planarization and stabilization of a laser-structured surface of an optoelectronic component, the optoelectronic component having a layer system comprising a first electrode, a second electrode, and at least one photoactive layer, wherein the at least one photoactive layer is disposed at least partly between the electrodes, and wherein the layer system is laser-structured, the coating comprising a polythiolene matrix, wherein the polythiolene matrix is formed by polymerization from at least one first monomer and one second monomer, wherein the first monomer is a polyfunctional thiol having at least three thiol groups ($R^1$—SH), the second monomer is a polyfunctional alkene having at least two C—C double bonds ( 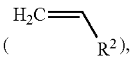 ), and the coating is disposed on the optoelectronic component and has at least partial direct contact with the layer system and/or diffusion contact with the layer system for at least the first monomer and/or the second monomer.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
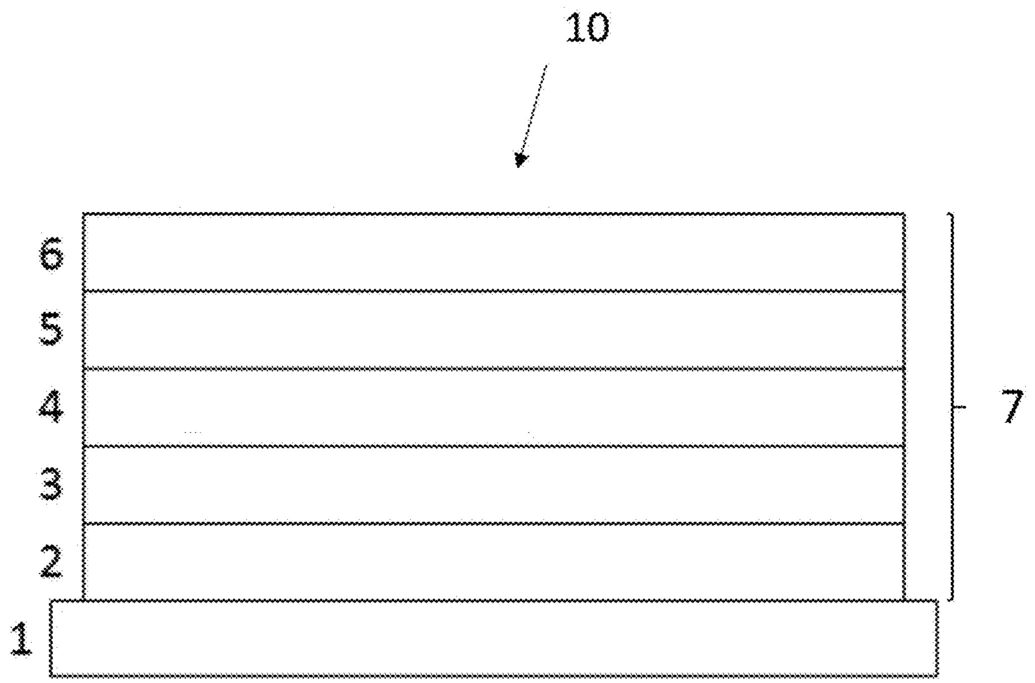
FIG. 1 illustrates a schematic diagram of a working example of a layer system of an optoelectronic component in cross section.

In an embodiment, the invention to provide a coating for planarization and stabilization of a laser-structured surface of an optoelectronic component, a method of coating a surface of a laser-structured optoelectronic component with such a coating, an optoelectronic component with such a coating, and a use of such a coating as winding protection for an optoelectronic component and/or for a semifinished product for production of an optoelectronic component, wherein the disadvantages mentioned do not occur, and wherein it is especially possible to apply a protective layer to a layer system of an electronic component without occurrence of adverse interactions with the layer system, especially electrodes and/or a photoactive layer of the layer system.

In an embodiment, the invention in particular provides a coating having direct contact of the coating or diffusion contact of the coating with an electrode or a photoactive layer, in particular an organic photoactive layer, in particular without impairment of function thereof, and especially without damage thereto.

The technical problem underlying the present invention is that of firstly stabilizing bulges, especially formed as a result of laser structuring of the individual layers of the layer system of the optoelectronic component, in order to enable sealing or tight enclosure by means of a thin layer, which eliminates the disadvantages found in the prior art, and secondly can be integrated into a roll-to-roll method. The coating is especially intended to enable protection and winding of the semifinished product, which can subsequently be processed further.

Advantages of the present invention are achieved in that a coating for planarization and stabilization of a laser-structured surface of an optoelectronic component is provided, wherein the optoelectronic component has a layer system, wherein the layer system comprises a first electrode, a second electrode, and at least one photoactive layer, wherein the at least one photoactive layer is disposed at least partly between the electrodes, and wherein the layer system is laser-structured. The coating has a polythiolene matrix, preferably consists of a polythiolene matrix, wherein the polythiolene matrix is formed by means of polymerization from at least one first monomer and one second monomer, wherein the first monomer is a polyfunctional thiol having at least three thiol groups $R^1$—SH, preferably terminal thiol groups,
wherein the second monomer is a polyfunctional alkene having at least two C—C double bonds

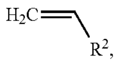

preferably terminal C—C double bonds, and
wherein the coating is disposed on the optoelectronic component and has at least partial direct contact with the layer system and/or diffusion contact with the layer system for at least the first monomer and/or the second monomer. $R^1$ here is an organic residue having at least two thiol groups, preferably an alkyl residue having at least two thiol groups. $R^2$ here is an organic residue having at least one C—C double bond, preferably an alkyl residue having at least one C—C double bond.

This especially protects the layer system of the optoelectronic component, in particular electrodes or a photoactive layer of the layer system, for transport and/or a phase of the final production, from environmental influences and as a result of damage in the course of further processing. The coating is electrically insulating at least in the cured state. The coating of embodiments of the invention planarizes and stabilizes the laser-structured surface of the layer system. The optoelectronic component may be a semifinished product or a final product.

In an embodiment of the invention, the optoelectronic component has a substrate, with the layer system disposed on the substrate.

In an embodiment of the invention, the layer system has further functional layers, in particular transport layers and/or passivation layers.

A coating is in particular understood to mean a protective layer, preferably a barrier layer, for prevention of permeability to outside influences, preferably of air, in particular oxygen, and/or moisture, in particular water, in order to increase mechanical durability, in particular scratch resistance.

A coating and/or at least one monomer for forming a coating disposed at least partly directly on an optoelectronic component is in particular understood to mean at least partial direct contact of the coating and/or of at least one monomer for forming the coating with a layer system of the optoelectronic component, in particular a photoactive layer or an electrode, i.e. at least one component of the coating with at least one component of the layer system, with preferably no further layer or no further material disposed in between.

In an embodiment of the invention, the coating is a barrier layer.

A barrier layer is in particular understood to mean a protective layer that forms a barrier against chemical compounds, impurities, moisture and/or oxygen. The barrier layer is especially a protective layer for prevention of permeability to outside influences, in particular of atmospheric oxygen and/or moisture, a protective layer for increasing mechanical durability, in particular scratch resistance, and/or a filter layer, preferably a layer with a UV filter.

Laser structuring of an optoelectronic component, in particular of electrodes, layers of a layer system and/or a layer system, is in particular understood to mean interconnection of individual photovoltaic cells in an optoelectronic component or an electrical separation of photovoltaic cells. As a result of the laser structuring of the surface, in particular, the at least one photoactive layer is at least partly exposed and is not fully covered by an electrode, in particular an electrode layer. The laser structuring forms a topology, morphology, particles and/or bulges that lead to an uneven, nonplanar surface. The laser structuring can give rise to bulges, called laser scribes, that are several times in excess of the height of the layers of the flat topology of a layer system of an organic photovoltaic element. As a result, it is firstly possible only with difficulty to apply further layers, in particular a barrier layer; secondly, in the case of subsequent encapsulation, any layer already applied may be damaged.

In the case of planarization of layers of an optoelectronic component, in particular the layer system, unevenness of the surface is especially covered to such an extent that unevenness, in particular bulges, is covered, for example by the laser structuring of the layer system. The planarization especially affords an optoelectronic component having a uniform layer thickness. For this purpose, more material of the coating is applied in lower-lying regions on the surface of the optoelectronic component than in higher-lying regions. After the application of the planarization layer or coating, the optoelectronic component together with the layer system is largely planar.

Stabilization is in particular understood to mean stabilization of a particular surface structure of the layer system, especially a topology and/or morphology of the layer system. Ideally, stabilization enables winding and unwinding during the later process steps for production of the finished product in the roll-to-roll process and/or during the rolling-up of the finished product.

The planarization and stabilization especially results in planarization and stabilization of bulges in the layer system formed in a laser structuring operation. In an embodiment of the invention, stabilization is understood to mean fixing of the laser-structured surface of the optoelectronic component. The planarization and stabilization of the bulges formed by laser structuring is assured by the coating of the invention.

In an embodiment of the invention, the optoelectronic component is an LED, an OLED, a photovoltaic element, in particular a solar cell, an organic photovoltaic element, in particular an organic solar cell, or a photodetector, in particular an organic photodetector.

In an embodiment of the invention, at least one photoactive layer is at least partly disposed at the surface of the layer system and/or is at least partly accessible from the surface of the layer system; in particular, the layer system, for this purpose, has grooves or channels formed by means of the laser structuring. The layer system is preferably not completely covered by the electrodes.

In an embodiment of the invention, the coating is disposed on the optoelectronic component, with the coating having at least partial direct contact with at least one photoactive layer of the layer system and/or diffusion contact with at least one photoactive layer of the layer system for at least the first monomer and/or the second monomer. In an embodiment of the invention, the coating is disposed on a diffusion-permeable adjacent layer of the layer system.

In an embodiment of the invention, the coating is disposed on a barrier layer already disposed on the layer system or is applied to a barrier layer already disposed on the layer system, in which case the barrier layer does not completely seal the optoelectronic component, in particular layer system, such that there is direct contact of the coating with the layer system at least in part, i.e. at individual sites, especially by virtue of fine cracks, defects and/or a barrier layer that has not been formed cleanly, for example by virtue of an SiOCH layer formed on the layer system.

An SiOCH layer is in particular understood to mean a layer comprising silicon oxide (SiOx), which receives organic properties by means of a carbon content, meaning that the carbon content influences the chemical microstructure and the polymer-like partly crosslinked chain structure. The material is more elastic and flexible than SiOx, being a nanoporous material that has flexible and/or elastic properties.

Direct contact of the coating with the layer system is in particular understood to mean direct contact of at least one constituent, in particular at least the first monomer and/or the second monomer, with the layer system, in particular an electrode and/or a photoactive layer of the layer system. Direct contact may arise, for example, from incomplete arrangement of an electrode on the at least one photoactive layer, on account of laser structuring of the layer system or on account of cracks in an electrode and/or a protective layer disposed on the electrode.

Diffusion contact of the coating with the layer system is in particular understood to mean indirect contact of at least one constituent of the coating, in particular the first monomer and/or the second monomer, via at least one intervening material, in particular at least one intervening layer, with the layer system, in particular an electrode and/or a photoactive layer of the layer system, where the at least one constituent of the coating is able to pass through the at least one intervening material, in particular the at least one intervening layer.

In an embodiment of the invention, the coating does not include any material which is incompatible in respect of the layer system, in particular any incompatible solvent, and/or moisture, which can impair and/or damage the layer system.

In an embodiment of the invention, the coating is not formed from acrylates and/or methacrylates. In an embodiment of the invention, the coating does not include any polyacrylates.

In an embodiment of the invention, the coating does not include any siloxane (polysiloxane) and/or any silane.

In an embodiment of the invention, the coating is free of water and solvent. This prevents or at least reduces leaching of the organic materials out of the layer system and/or breakdown of the layer system, for example by diffusion.

In an embodiment of the invention, the coating is applied completely to the optoelectronic component. In an embodiment of the invention, the coating is disposed over the entire surface of the optoelectronic component. In an embodiment of the invention, the coating is applied to regions of the layer system. In an embodiment of the invention, contact sites of the optoelectronic component are kept clear of the coating, preferably without having to free them subsequently from a protective layer.

In an embodiment of the invention, the photovoltaic element has a cell with at least one photoactive layer, especially a CIS, CIGS, GaAs or Si cell, a perovskite cell or an organic photovoltaic element (OPV), called an organic solar cell. An organic photovoltaic element is in particular understood to mean a photovoltaic element having at least one organic photoactive layer, especially a polymeric organic photovoltaic element or an organic photovoltaic element based on small molecules. While it is a feature of polymers that they are not evaporable and therefore can be applied only from solutions, small molecules are usually evaporable and can be applied either as a solution like polymers or else by means of evaporation methodology, especially by evaporation from reduced pressure. The organic photoactive layer is especially a photoactive layer in which excitons (electron-hole pairs) are formed by radiating visible light, UV radiation and/or IR radiation. The organic materials here are applied to the films in the form of thin films or small volumes by printing, adhesive bonding, coating, vapor deposition, or in some other way.

In an embodiment of the invention, the at least one photoactive layer is formed from organic materials, preferably from small organic molecules or polymeric organic molecules, in particular preferably from small organic molecules. In an embodiment of the invention, the photoactive layer of the layer system includes small molecules that are evaporable under reduced pressure. In an embodiment of the invention, the layers of the layer system are applied by evaporating small organic molecules.

The coating of the invention for planarization and stabilization of a laser-structured surface of an optoelectronic component has advantages compared to the prior art. It is surprisingly possible to apply the coating of the invention directly to the electrodes and/or the photoactive layer of a layer system without damaging it. Advantageously, the coating protects the layer system from environmental influences and damage before and during the final production. Advantageously, the coating can be applied in liquid form directly to the layer system, in particular the electrodes and/or the photoactive layer, without damaging it. Advantageously, the coating of the invention has particularly good adhesion to optoelectronic components. Advantageously, the coating prevents short circuits as a result of the bulges folding over or folding in after the laser structuring. Advantageously, a continuous planar topology is provided. In this way, it is especially possible to more easily apply a subsequent encapsulation, for example a thin-layer encapsulation. Advantageously, the method is performable in a roll-to-roll method for production of an optoelectronic component. Advantageously, the adhesion of a subsequent applied barrier layer or an encapsulation is improved. Advantageously, the coating prevents detachment of the layer system from the substrate, especially on unrolling in a roll-to-roll method, especially in the case of prolonged storage times before further processing in the case of semifinished products. Advantageously, winding and unwinding during the roll-to-roll method is enabled. Advantageously, the coating, in the case of subsequent encapsulation of the optoelectronic component with a barrier film and adhesive, enables protection of the organic photoactive layer system from unwanted interaction, especially with the adhesive. Advantageously, for the complete production of a finished version of the optoelectronic component, multiple successive roll-to-roll systems may be used. The layer system is protected from solvents and/or mechanical stress by the coating between the operating steps. Advantageously, the method of producing the coating is simple, flexible and inexpensive, and integratable into a roll-to-roll method.

A roll-to-roll method is in particular understood to mean the production of flexible electronic components that are printed onto a sheet of flexible polymer films or metal foils. The substrate present on a roll is unrolled, processed and finally rolled up again. A roll-to-roll method is in particular understood to mean a continuous process regime whereby individual components are processed successively. Specifically, this means that at least optoelectronic components or semifinished versions of optoelectronic components are produced in more than one method step by a continuous method. The roll-to-roll method is characterized, for example, by a continuous substrate, in particular of a polymer film, for example PET or PEN. Materials are applied to this substrate for formation of electronic components, in particular by vapor deposition, printing, coating, sputtering or plasma deposition.

In an embodiment of the invention, the coating is at least substantially transparent to light in the visible wavelength range, in particular at least largely transparent.

In an embodiment of the invention, the coating is disposed on the optoelectronic component in a form-fitting manner, especially in a cohesive manner.

An optoelectronic component is in particular understood to mean a photovoltaic element. A photovoltaic element is in particular understood to mean a photovoltaic cell, in particular a solar cell. The photovoltaic element is preferably formed from multiple photovoltaic cells that may be interconnected in series or in parallel. The multiple photovoltaic cells may be disposed and/or interconnected in different ways in the optoelectronic component. In an embodiment, an optoelectronic component is understood to mean a semi-finished version of an optoelectronic component.

In an embodiment of the invention, the first monomer has at least four thiol groups, where the thiol groups are preferably each at a terminal end.

In an embodiment of the invention, the second monomer has at least three C—C double bonds, preferably at least four C—C double bonds, where the C—C double bonds are preferably each at a terminal end.

In an embodiment of the invention, the polythiolene matrix is additionally formed from at least one third monomer and/or at least one further component, where the at least one third monomer has at least two thiol groups, wherein the thiol groups are preferably each at a terminal end, and where the at least one further component is selected from the group consisting of an additive, a flame retardant, a filler, an inhibitor, an initiator, and a stabilizer.

In an embodiment of the invention, the coating is additionally formed from at least one third monomer, where the at least one third monomer has at least two thiol groups, preferably at least three thiol groups, where the thiol groups are preferably each at a terminal end.

In an embodiment of the invention, the coating is additionally formed from at least one fourth monomer, where the at least one fourth monomer has at least one C—C double bond, where the C—C double bond is preferably at a terminal end; in particular preferably, the at least one fourth monomer has at least two C—C double bonds, where the C—C double bonds are preferably each at a terminal end.

In an embodiment of the invention, the coating includes at least one compound having a functional urethane group, preferably having at least two functional urethane groups, preferably having three functional urethane groups, where a urethane group, also called urethane hereinafter, is understood to mean a —NH—CO—O— group.

In an embodiment of the invention, the coating contains at least one urethane in an amount of 5% to 30% by weight of the coating, based on the total weight of the coating, preferably of 10% to 30% by weight, preferably of 15% to 30% by weight, preferably 5% to 20% by weight, preferably 5% to 10% by weight, preferably of 10% to 20% by weight, or preferably 15% to 30% by weight, where the urethane has one functional urethane group, or preferably two functional urethane groups.

In an embodiment of the invention, the first monomer and/or the third monomer has the at least one urethane group.

In an embodiment of the invention, the first monomer is a mercapto ester, the first monomer preferably being selected from the group consisting of:

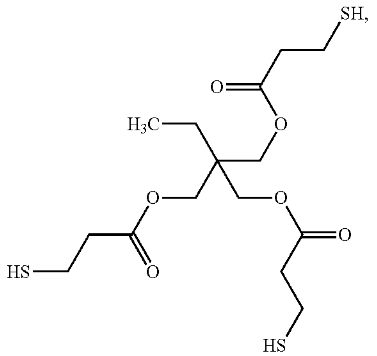

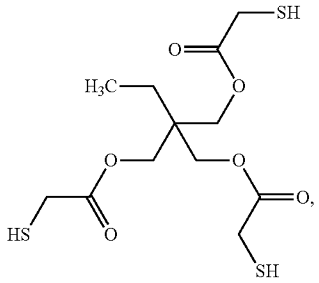

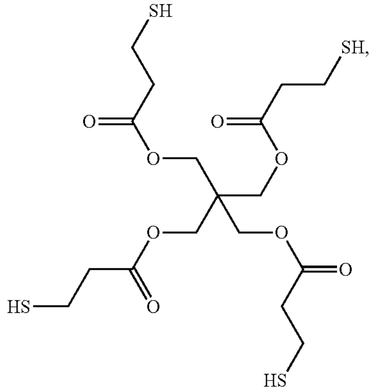

and

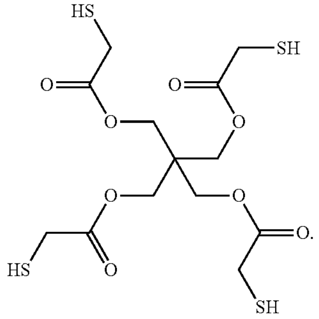

In an embodiment of the invention, the C—C double bonds are allyl groups and/or vinyl groups, where the second monomer is preferably a triallyl isocyanurate or a triallyl cyanurate, in particular preferably selected from the group consisting of:

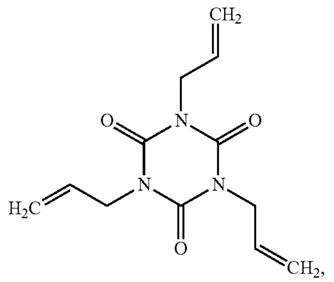

and

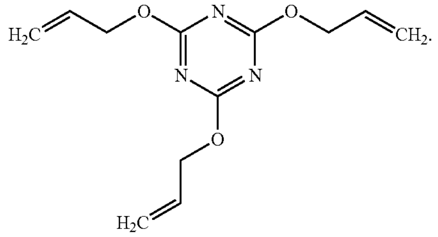

In an embodiment of the invention, the molar ratio of the first monomer to the second monomer is 2:1 to 0.7:1, preferably 2:1 to 1:0.9, preferably 1.6:1 to 1:0.9, preferably 1.5:1 to 1:1, or preferably 1.2:1 to 1:1.

In an embodiment of the invention, the coating, in particular the monomer mixture, has a proportion of the at least one first monomer of 30% to 60% by weight, preferably of 35% to 60% by weight, preferably of 30% to 55% by weight, preferably of 30% to 50% by weight, or preferably of 35% to 50% by weight, based on the total weight of the coating, in particular based on the total weight of the monomer mixture.

In an embodiment of the invention, the coating, in particular the monomer mixture, has a proportion of the at least one second monomer of 10% to 60% by weight, preferably 20% to 60% by weight, preferably of 30% to 55% by weight, preferably of 10% to 50% by weight, preferably of 10% to 40% by weight, or preferably of 10% to 30% by weight, based on the total weight of the coating, in particular based on the total weight of the monomer mixture.

In an embodiment of the invention, the coating is formed from a proportion of the first monomer and of the second monomer of at least 60% by weight, preferably at least 70% by weight, preferably at least 80% by weight, preferably at least 85% by weight, preferably at least 90% by weight, preferably at least 95% by weight, preferably at least 98% by weight, preferably at least 99% by weight, preferably at least 99.5% by weight, or preferably at least 99.9% by weight, based in each case on the total weight of the coating.

In an embodiment of the invention, the coating has flexible properties, where an elasticity (modulus of elasticity) of the coating, preferably of the polythiolene matrix, is 80 000 psi to 360 000 psi, preferably 100 000 psi to 300 000 psi, preferably 120 000 psi to 260 000 psi, or preferably 100 000 psi to 200 000 psi. The elasticity preferably relates to a cured coating, preferably a cured, in particular crosslinked, polythiolene matrix.

In an embodiment of the invention, a layer thickness of the coating is 1 μm to 2000 μm, preferably 1 μm to 1000 μm, preferably 1 μm to 100 μm, preferably 1 μm to 10 μm, preferably 5 μm to 1000 μm, preferably 10 μm to 1000 μm, preferably 10 μm to 500 μm, preferably 10 μm to 200 μm, preferably 10 μm to 100 μm, preferably 20 μm to 200 μm, preferably 20 μm to 100 μm, preferably 20 μm to 100 μm, preferably 50 μm to 500 μm, preferably 50 μm to 200 μm, or preferably 50 μm to 100 μm. In an embodiment of the invention, the layer thickness of the coating is at least 100 μm, preferably at least 1000 μm, or preferably at least 2000 μm.

In an embodiment of the invention, at least two layers of the coating are disposed on the optoelectronic component, preferably three layers of the coating.

In an embodiment of the invention, the layer thickness of the coating is adjusted such that the coating fully covers particles, and bulges that have been formed by the laser structuring. In an embodiment of the invention, the coating covers the layer system completely. In an embodiment of the invention, the coating does not cover the region of the busbar and/or the contacts.

In an embodiment of the invention, an SiOCH layer is disposed at least partly between the coating and the optoelectronic component, in particular between the coating and the layer system of the optoelectronic component.

In an embodiment of the present invention, a method is provided of coating a surface of a laser-structured optoelectronic component with a coating of the invention, in particular according to one of the working examples described above. This method comprises the following steps:

a) providing an optoelectronic component with a layer system having a first electrode, a second electrode, and at least one photoactive layer disposed between the two electrodes, wherein the optoelectronic component is laser-structured,
b) providing at least one first monomer and one second monomer, wherein the first monomer is a polyfunctional thiol having at least three thiol groups, and the second monomer is a polyfunctional alkene having at least two C—C double bonds,
c) mixing the at least first monomer and second monomer to obtain a monomer mixture,
d) applying the monomer mixture to the optoelectronic component, wherein the first monomer and/or the second monomer has at least partial direct contact with the layer system and/or has diffusion contact with the layer system, and
e) curing the monomer mixture by polymerizing to form the coating, wherein the laser-structured surface of the layer system is planarized and stabilized, such that the layer system is not damaged. For the method of coating a surface of a laser-structured optoelectronic component, this especially gives rise to the advantages that have already been described in connection with the coating for planarization and stabilization of a laser-structured surface of an optoelectronic component.

In an embodiment of the invention, at least the photoactive layer of the layer system has been applied by vapor deposition with small molecules under reduced pressure.

In an embodiment of the invention, the coating is formed at least partly directly on the layer system, in particular at least partly directly on the at least one photoactive layer; in particular, the monomer mixture for forming the coating is applied at least partly directly to the layer system, in particular at least partly directly to the at least one photoactive layer.

In an embodiment of the invention, the at least one first monomer and the at least one second monomer are provided as a monomer mixture in step b), and so the mixing in step c) is dispensed with.

In an embodiment of the invention, the method is conducted under protective gas, preferably nitrogen.

In an embodiment of the invention, the proportion of the first monomer and of the second monomer in the monomer mixture is at least 60% by weight, based on the total weight of the monomer mixture, preferably at least 70% by weight, preferably at least 80% by weight, preferably at least 85% by weight, preferably at least 90% by weight, preferably at least 95% by weight, preferably at least 98% by weight, or preferably at least 99% by weight.

In an embodiment of the invention, the monomer mixture is applied in liquid form.

In an embodiment of the invention, the monomer mixture does not include any material which is incompatible in respect of the layer system, in particular any incompatible solvent, and/or moisture, which can impair and/or damage the layer system.

In an embodiment of the invention, the monomer mixture does not include any acrylate and/or methacrylate.

In an embodiment of the invention, the monomer mixture includes at least one initiator and/or at least one catalyst for acceleration and/or improvement of the polymerization of the at least first and second monomer.

In an embodiment of the invention, the viscosity of the monomer mixture is 200 mPas to 9000 mPas, preferably 200 mPas to 3000 mPas, preferably 200 mPas to 2000 mPas, preferably 200 mPas to 1000 mPas, preferably 300 mPas to 3000 mPas, preferably 300 mPas to 2000 mPas, preferably 300 mPas to 1000 mPas, preferably 1000 mPas to 5000 mPas, preferably 1000 mPas to 4000 mPas, preferably 2000 mPas to 4000 mPas, preferably 1000 mPas to 3000 mPas, or preferably 1500 mPas to 2500 mPas. As a result, the monomer mixture for forming the coating adheres on the surface of the optoelectronic component, and it is especially ensured that the coating is disposed in a form-fitting and/or cohesive manner on the optoelectronic component.

In an embodiment of the invention, the monomer mixture is cured by means of UV curing, dual curing, thermal curing, and/or a reaction gas.

In an embodiment of the invention, the monomer mixture is applied to the optoelectronic component at a temperature of 20° C. to 60° C., preferably of 20° C. to 50° C., preferably of 20° C. to 40° C., preferably of 20° C. to 30° C., preferably of 25° C. to 50° C., preferably of 25° C. to 40° C., or preferably of 30° C. to 50° C.

In an embodiment of the invention, the applied monomer mixture is cured at a temperature of 30° C. to 200° C., preferably of 50° C. to 150° C., preferably of 80° C. to 150° C., preferably of 30° C. to 100° C., preferably of 50° C. to 100° C., preferably of 50° C. to 80° C., or preferably of 30° C. to 60° C.

The time required for drying of the monomer mixture applied is chosen especially depending on the nature of the monomer mixture and on the layer thickness of the monomer mixture applied. In an embodiment of the invention, the monomer mixture applied is dried over a period of 10 s to 300 s, preferably of 10 s to 200 s, preferably of 10 s to 100 s, preferably of 10 s to 50 s, or preferably of 10 s to 20 s.

In an embodiment of the invention, the monomer mixture applied, in particular after the curing of the monomer mixture, is dried at a temperature of 30° C. to 70° C., preferably of 30° C. to 60° C., preferably of 30° C. to 50° C., preferably of 30° C. to 40° C., preferably of 40° C. to 60° C., or preferably of 40° C. to 50° C.

In an embodiment of the invention, the method is conducted in a roll-to-roll method, preferably a continuous roll-to-roll method. In a roll-to-roll method, the substrate has in particular been rolled up onto a roll and hence runs continuously into a closed system. The layer system is formed therein. The layer system is preferably manufactured under reduced pressure. If the optoelectronic component is a semifinished product, the semifinished product can be sent to further processing. As a result of the coating, in particular the coating as winding protection, the semifinished product is not damaged either by rolling-up or by contact of the surfaces. In addition, the winding protection prevents detachment of the layer system from the substrate, for example in the course of rolling and unrolling.

In an embodiment of the invention, the monomer mixture is applied by means of a printing method, preferably a screenprinting method, a plotting method, an inkjet printing method or a 3D printing method, a slot die method, a comma bar method or a rakel method, and wherein the pressure for application of the monomer mixture is preferably less than 200 kPa, preferably less than 50 kPa, preferably less than 10 kPa, or preferably less than 5 kPa.

The coating may be applied either permanently or temporarily to the optoelectronic component. What is meant by "temporary" is more particularly that the coating can be removed without residue in a later processing operation on the optoelectronic component in the form of a semifinished product, such that the removing of the additional layer does not cause any damage to the layer system. In an embodiment of the invention, the coating is applied as a temporary coating and can be removed again without residue at a later juncture prior to the further processing of the optoelectronic component, without damage to the layer system on removal of the coating.

In an embodiment of the invention, the coating is structured at the surface, such that a subsequent adhesive layer and/or barrier layer adheres better.

In an embodiment of the present invention, advantages are achieved by providing an optoelectronic component, preferably a flexible optoelectronic component, with a coating of the invention and/or produced by a method of the invention, in particular according to one of the working examples described above. For the optoelectronic component, this especially gives rise to the advantages that have already been described in connection with the coating for planarization and stabilization of a laser-structured surface of an optoelectronic component and with the method of coating a surface of a laser-structured optoelectronic component. The optoelectronic component has a layer system having at least two electrodes and at least one photoactive layer, wherein the at least one photoactive layer is disposed between the two electrodes, wherein the coating has at least partial direct contact with the layer system and/or diffusion contact with the layer system.

In an embodiment of the invention, the optoelectronic component is a flexible optoelectronic component. In an embodiment of the invention, the flexible optoelectronic component is a flexible photovoltaic element, in particular a flexible organic photovoltaic element.

A flexible optoelectronic component is in particular understood to mean an optoelectronic component that is bendable and/or extensible in a particular region.

In an embodiment of the present invention, advantages are also achieved by providing a use of a coating of the invention as winding protection for an optoelectronic component and/or for a semifinished product for production of an optoelectronic component, preferably in a roll-to-roll method, in particular according to one of the above-described working examples. For the use of the coating, this especially gives rise to the advantages that have already been described in connection with the coating for planarization and stabilization of a laser-structured surface of an optoelectronic component, with the method of coating a surface of a laser-structured optoelectronic component, and with the optoelectronic component with a coating of the invention. The coating here protects the optoelectronic component and/or the semifinished product, in particular the layer system of the optoelectronic component and/or the semifinished product, at least temporarily from outside influences, without damage to the optoelectronic component and/or the semifinished product.

Winding protection is in particular understood to mean a protective layer for protection of an optoelectronic component from environmental influences and/or damage. After the application of the coating as winding protection, transfer of an optoelectronic component coated with the coating to a further system in which further operating steps are conducted is enabled.

In an embodiment of the invention, the optoelectronic component is a semifinished product; accordingly, the optoelectronic component to which the coating is applied is a semifinished product for production of a final optoelectronic component.

A semifinished product is in particular understood to mean a precursor of an optoelectronic component where at least one further method step is necessary, i.e. a further processing operation, in order to obtain a final optoelectronic component. A semifinished product is preferably understood to mean an optoelectronic component, in particular a photovoltaic cell, which does not yet have a barrier layer or does not yet have all the barrier layers and/or has not yet been encapsulated. By contrast, the electronic component, after the final production, has preferably been provided and/or encapsulated with all barrier layers, in particular equipped with the necessary terminals for electrical contact connection.

In an embodiment of the invention, the coating is removable again without residue prior to final production of the optoelectronic component, such that the optoelectronic component, in particular the layer system of the optoelectronic component, and/or the semifinished product are not damaged on removal of the coating.

The invention is elucidated in detail hereinafter with reference to the drawings.

The working examples in particular relate to an optoelectronic component produced in a roll-to-roll method, preferably organic layers including materials based on small molecules.

FIG. 1 shows a schematic diagram of a working example of a layer system 7 of an optoelectronic component 100 in cross section;

The optoelectronic component 100, in particular an organic photovoltaic element, consists of a sequence of thin layers, with the layer system 7, with at least one photoactive layer 4 which has preferably been applied by vapor deposition under reduced pressure or processed from a solution. The electrical connection can be effected by metal layers, transparent conductive oxides and/or transparent conductive polymers. The vacuum vapor deposition of the organic layers is especially advantageous in the case of production of multilayer photovoltaic elements, in particular tandem or triple cells.

A layer system 7 of such an optoelectronic component 100 is shown in a working example in FIG. 1. The optoelectronic component 100 has a layer system 7 having at least two electrodes 2, 6 and at least one photoactive layer 4 with at least one absorber material on a substrate 1, wherein the at least one photoactive layer 4 is disposed between the two electrodes 2, 6. The layer system 7 with the electrodes 2, 6 is laser-structured. The layer system 7 may also have a hole transport layer 5 and a charge carrier layer 3.

Figure 2:
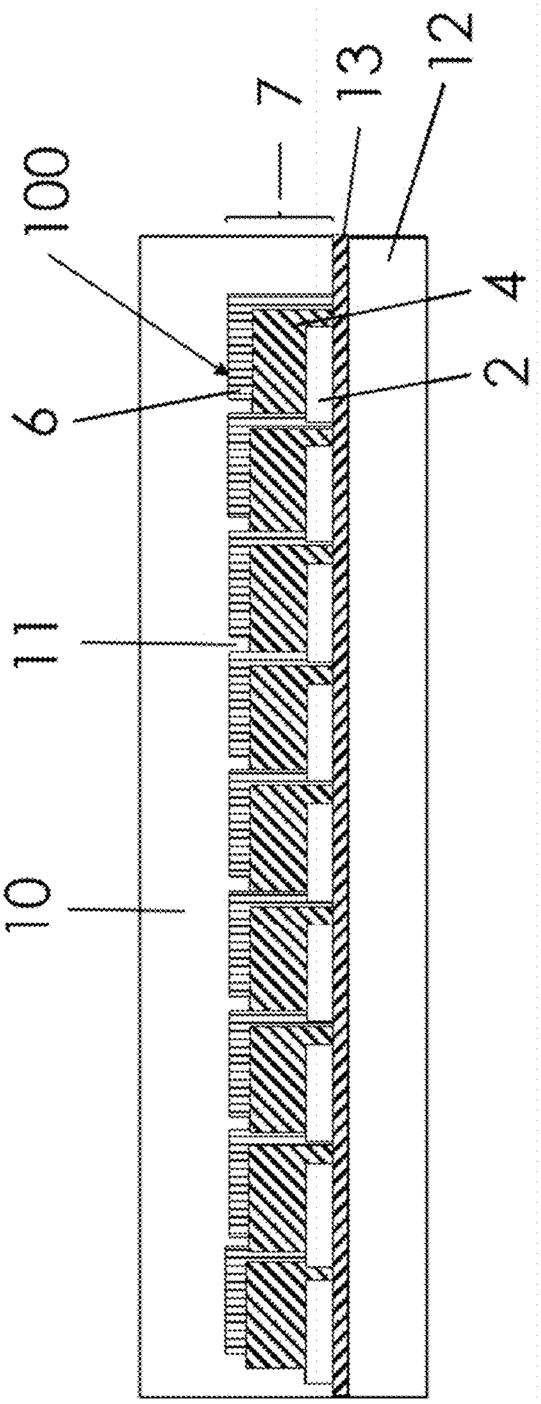
FIG. 2 illustrates a schematic diagram of a working example of an optoelectronic component having a coating for planarization and stabilization of a laser-structured surface of the optoelectronic component in cross section.

FIG. 2 shows a schematic diagram of a working example of an optoelectronic component 100 having a coating 10 for planarization and stabilization of a laser-structured surface 11 of the optoelectronic component 100 in cross section. Elements that are the same and have the same function are given the same reference numerals, and so reference may be made to the preceding description in this respect.

The coating 10 for planarization and stabilization of a laser-structured surface 11 of an optoelectronic component 100 is disposed at least partly on the layer system 7 of the optoelectronic component 100, wherein the optoelectronic component 100 has a layer system 7, wherein the layer system 7 comprises a first electrode 2, a second electrode 6, and at least one photoactive layer 4, wherein the at least one photoactive layer 4 is disposed at least partly between the electrodes 2, 6, and wherein the layer system 7 is laser-structured. The coating 10 has a polythiolene matrix, preferably consists of a polythiolene matrix, wherein the polythiolene matrix is formed by means of polymerization of at least one first monomer and one second monomer, wherein the first monomer is a polyfunctional thiol having at least three thiol groups $R^1$—SH, preferably terminal thiol groups, wherein the second monomer is a polyfunctional alkene having at least two C—C double bonds

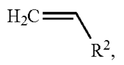

preferably terminal C—C double bonds, and wherein the coating 10 is disposed on the optoelectronic component 100 and has at least partial direct contact with the layer system 7 and/or diffusion contact with the layer system 7 for at least the first monomer and/or the second monomer.

The optoelectronic component 100 provided has in particular been produced in a roll-to-roll method.

The coating 10 of the optoelectronic component 100 may be applied directly to the electrodes 2, 6 and/or the photoactive layer 4 of a layer system 7 without damaging it, with provision especially of a planar topology. The coating 10 may be applied in liquid form directly to the layer system 7. Advantageously, the method is implementable in a roll-to-roll method for production of an optoelectronic component 100 or a semifinished version thereof. Advantageously, winding and unwinding of the coating 10 during the roll-to-roll method is enabled. The coating 10 prevents detachment of the layer system 7 from the substrate 12, in particular on unrolling in a roll-to-roll method, in particular in further processing of semifinished versions of the optoelectronic component 100. Advantageously, the coating 10 protects the layer system 7 from environmental influences and damage before and during the final production.

In an embodiment of the invention, the first monomer has at least four thiol groups, where the thiol groups are preferably each at a terminal end.

In an embodiment of the invention, the second monomer has at least three C—C double bonds, preferably at least four C—C double bonds, where the C—C double bonds are preferably each at a terminal end.

In an embodiment of the invention, the polythiolene matrix is additionally formed from at least one third monomer and/or at least one further component, where the at least one third monomer has at least two thiol groups, where the thiol groups are preferably each at a terminal end, and where the at least one further component is selected from the group consisting of an additive, a flame retardant, a filler, an inhibitor, an initiator, and a stabilizer.

In an embodiment of the invention, the first monomer is a mercapto ester, the first monomer preferably being selected from the group consisting of:

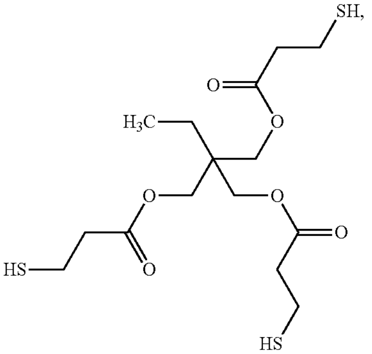

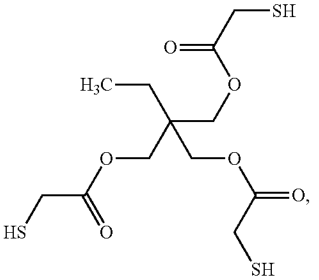

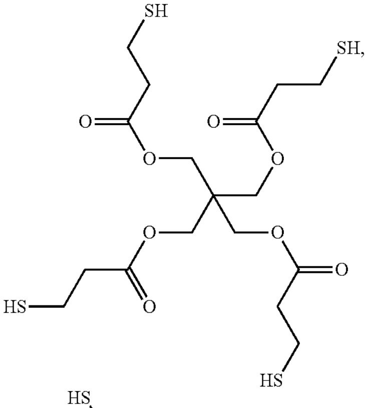

and

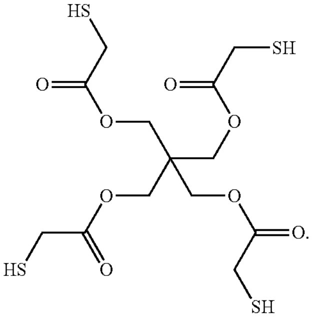

In an embodiment of the invention, the C—C double bonds are allyl groups and/or vinyl groups, where the second monomer is preferably a triallyl isocyanurate or a triallyl cyanurate, in particular preferably selected from the group consisting of:

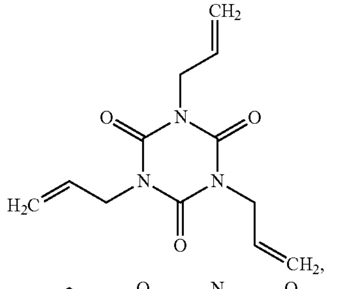

and

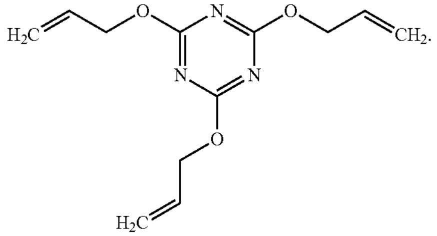

In an embodiment of the invention, the molar ratio of the first monomer to the second monomer is 2:1 to 1:0.9, preferably 1.5:1 to 1:1, or preferably 1.2:1 to 1:1. The first monomer is preferably in at least a small excess.

In an embodiment of the invention, the coating contains at least one urethane in an amount of 5% to 40% by weight of the coating, based on the total weight of the coating, preferably of 5 to 30% by weight, preferably of 10 to 30% by weight, preferably of 15 to 30% by weight, preferably of 5 to 20% by weight, preferably of 5 to 10% by weight, preferably of 10% to 20% by weight, or preferably of 15 to 30% by weight.

Compositions are obtainable, for example, under the NOA61, NOA63, NOA65 or NOA68 names from Nordland Products Inc. NOA61 contains 55-57% by weight of a tetrathiol and 43-45% by weight of a triallyl isocyanurate. NOA63 contains 70-75% by weight of NOA61 and 15-30% by weight of a urethane.

In an embodiment of the invention, the coating 10 has flexible properties, where an elasticity (modulus of elasticity) of the coating 10, preferably the polythiolene matrix, is 80 000 psi to 360 000 psi, preferably 100 000 psi to 300 000 psi, preferably 120 000 psi to 260 000 psi, and/or the layer thickness of the coating is 10 1 μm to 2000 μm, preferably 1 μm to 1000 μm, or preferably 20 μm to 100 μm.

In an embodiment of the invention, an SiOCH layer 14 is disposed at least in part between the coating 10 and the optoelectronic component 100, in particular between the coating 10 and the layer system 7 of the optoelectronic component 100. The SiOCH layer 14 may be deposited by means of plasma enhanced chemical vapor deposition (PECVD) methods, for example hollow cathode-assisted PECVD (arcPECVD) methods, via an HMDSO precursor or bis(trimethylsilyl-methane) (BTMSM) precursor or tetraethyl orthosilicate (TEOS) precursor or tetramethylsilane (TMS) precursor or hexamethyldisilazane (HMDSN) precursor.

In an embodiment of the invention, the optoelectronic component 100 is a flexible optoelectronic component 100 having an inventive coating 10 and/or produced by a method of the invention, having a layer system 7 having at least two electrodes 2, 6 and at least one photoactive layer 4, wherein the at least one photoactive layer 4 is disposed between the two electrodes 2, 6, wherein the coating 10 has at least partial direct contact with the layer system 7 and/or diffusion contact with the layer system 7.

In an embodiment of the invention, the optoelectronic component 100 is preferably a photovoltaic element, in particular preferably a flexible organic photovoltaic element.

The production of the organic optoelectronic component 100 by the roll-to-roll method is effected by the provision of a substrate 12 to which the layer system 7 is applied, in particular by application first of the first electrode 2 and then both of absorber layers and (partly) doped and/or undoped transport layers, in particular the photoactive layer 4. Subsequently, the second electrode 6 is applied. Individual applied layers, after the application, are at least partly laser-structured, or the layer system 7 is at least partly laser-structured after application of all the layers. It is alternatively possible to apply a barrier layer 13 between the substrate 12 and the layer system 7 for protection from moisture and/or atmospheric oxygen.

In one working example, the coating 10 may have a layer thickness of 10 μm to 2000 μm, preferably of 100 μm to 1000 μm. The coating 10 is at least largely electrically insulating.

In one embodiment, the optoelectronic component 100 is a semifinished version of an optoelectronic component 100, in particular a semifinished version in a roll-to-roll method. In the roll-to-roll method is on a continuous substrate 12 or on an optoelectronic component 100 having a substrate 12 comprising an electrode 2 disposed on the substrate 12, an organic layer system 7 and an electrode 6 on the side of the layer system 7 remote from the substrate 12, at least one photoactive organic layer 4 between the electrode 2 and the electrode 6, and a protective layer on the side of the at least one optoelectronic component 100 remote from the substrate 12, with the protective layer preferably fully covering the organic layer system 7.

In an embodiment of the invention, the optoelectronic component 100 is an organic optoelectronic component 100, preferably an organic solar cell, an OFET, an OLED or an organic photodetector.

The inventive coating 10 may in particular be used as winding protection for an optoelectronic component 100 and/or for a semifinished product for production of an optoelectronic component 100, preferably in a roll-to-roll method. The coating here protects the optoelectronic component 100 and/or the semifinished product, in particular the layer system 7 of the optoelectronic component 100 and/or of the semifinished product, at least temporarily from outside influences, without damage to the optoelectronic component 100 and/or the semifinished product.

Figure 3:
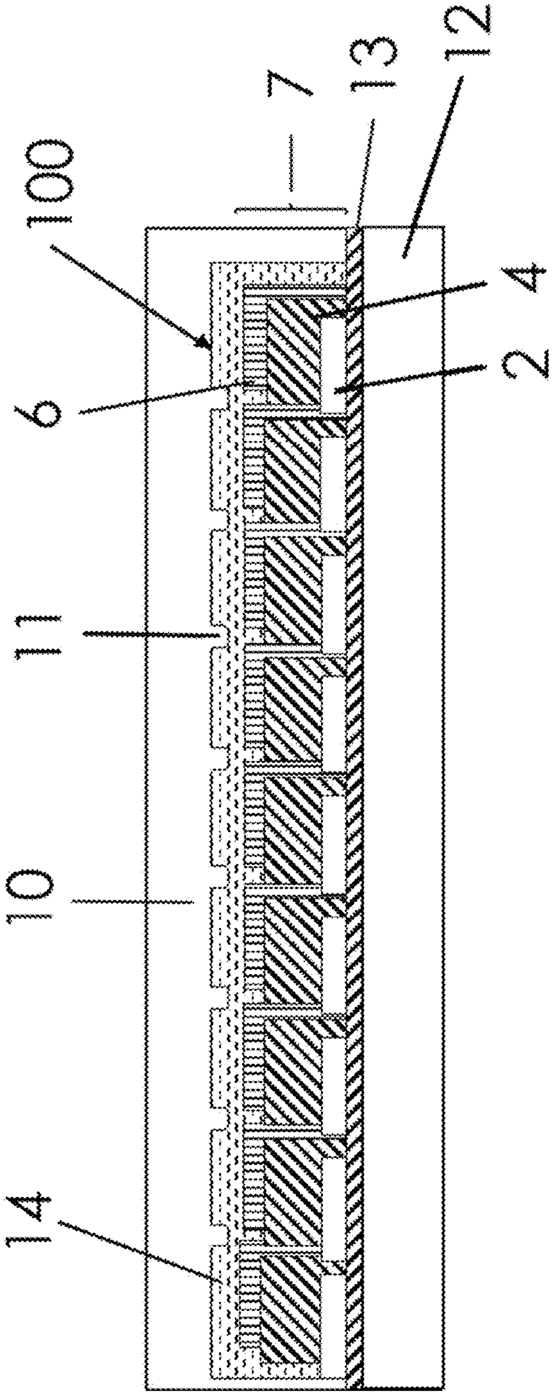
FIG. 3 illustrates a schematic diagram of a working example of an optoelectronic component having an SiOCH layer and having a coating for planarization and stabilization of a laser-structured surface of the optoelectronic component in cross section.

FIG. 3 shows a schematic diagram of a working example of an optoelectronic component 100 with an SiOCH layer 14 and with a coating 10 for planarization and stabilization of a laser-structured surface 11 of the optoelectronic component 100 in cross section. Elements that are the same and have the same function are given the same reference numerals, and so reference is made in this respect to the preceding description.

The coating 10 of the optoelectronic component 100 has at least partial direct contact with the layer system 7 and/or diffusion contact with the layer system 7.

Figure 4:
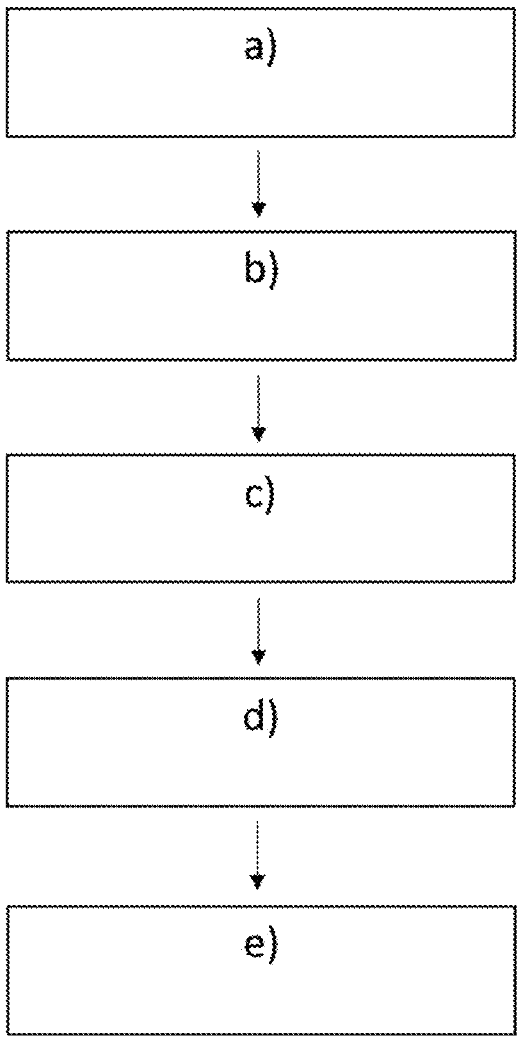
FIG. 4 illustrates a schematic diagram of a working example of a method of coating a surface of a laser-structured optoelectronic component with a coating in a flow diagram.

FIG. 4 shows a schematic diagram of a working example of a method of coating a surface 11 of a laser-structured optoelectronic component 100 with a coating 10 in a flow diagram. Elements that are identical and have the same function are given the same reference numerals, and so reference is made in this respect to the preceding description.

The method of coating a surface 11 of a laser-structured optoelectronic component 100 with an inventive coating 10 comprises the following steps: a) providing an optoelectronic component 100 with a layer system 7 having a first electrode 2, a second electrode 6, and at least one photoactive layer 4 disposed between the two electrodes 2, 6, wherein the optoelectronic component 100 is laser-structured, b) providing at least one first monomer and one second monomer, where the first monomer is a polyfunctional thiol having at least three thiol groups, and the second monomer is a polyfunctional alkene having at least two C—C double bonds, c) mixing the at least first monomer and second monomer to obtain a monomer mixture, d) applying the monomer mixture to the optoelectronic component 100, where the first monomer and/or the second monomer has at least partial direct contact with the layer system 7 and/or diffusion contact with the layer system 7, and e) curing the monomer mixture by polymerizing to form the coating 10, wherein the laser-structured surface 11 of the layer system 7 is planarized and stabilized, such that the layer system 7 is not damaged. In one working example, the monomer mixture is applied by means of a spin-coating method to the optoelectronic component 100.

In an embodiment of the invention, the viscosity of the monomer mixture is 200 mPas to 9000 mPas, preferably 300 mPas to 3000 mPas, and the monomer mixture is cured, in particular crosslinked, by means of UV curing, dual curing, thermal curing and/or a reaction gas.

In an embodiment of the invention, the method is conducted in a roll-to-roll method, preferably a continuous roll-to-roll method.

In an embodiment of the invention, the monomer mixture is applied by means of a printing method, preferably a screenprinting method, a plotting method, an inkjet printing method or a 3D printing method, a slot die method, a comma bar method or a rakel method, where the pressure for application of the monomer mixture is preferably less than 200 kPa, preferably less than 50 kPa, preferably less than 10 kPa, or preferably less than 5 kPa.

The monomer mixture applied is cured thermally at a temperature of 80 to 150° C. The monomer mixture applied may alternatively be cured by means of UV radiation, for example with a UV radiation dose of 0.150 $J/cm^2$ to 1.20 $J/cm^2$ in a wavelength range from 100 nm to 280 nm. Alternatively, the monomer mixture applied, having at least partly cured, in particular the coating 10, may be dried in a further step, for example at 30° C. to 60° C. The monomer mixture applied was cured in a Fusion UV System LC6B Benchtop at a speed of 1.83 m/min.

The coating 10 is applied in particular prior to winding-up of the flexible optoelectronic component 100, prior to transport to another system, or after transport under nitrogen to another system.

FIG. 5 shows experimental results of laser-structured optoelectronic components 100 with an inventive coating 10 and a noninventive coating. The optoelectronic component 100 in the present working example is a photovoltaic element.

A comparison was made here, as winding protection for the photovoltaic element, of an inventive coating 10 of NOA63 and a protective layer of BS1, which is widely used as winding protection for optoelectronic components. The inventive coating 10 was produced from a liquid monomer mixture with subsequent curing by UV irradiation to obtain the winding protection; in the case of the noninventive winding protection, BS1 was applied as adhesive film to the photovoltaic element. BS1 is a transfer film of polyester that has been coated with a PSA (pressure-sensitive adhesive) composed of polysiloxanes. BS1 is applied by the PSA-coated side of the film to the optoelectronic component 100. The film with the PSA coating has a thickness of about 60 μm.

Figure 5A:
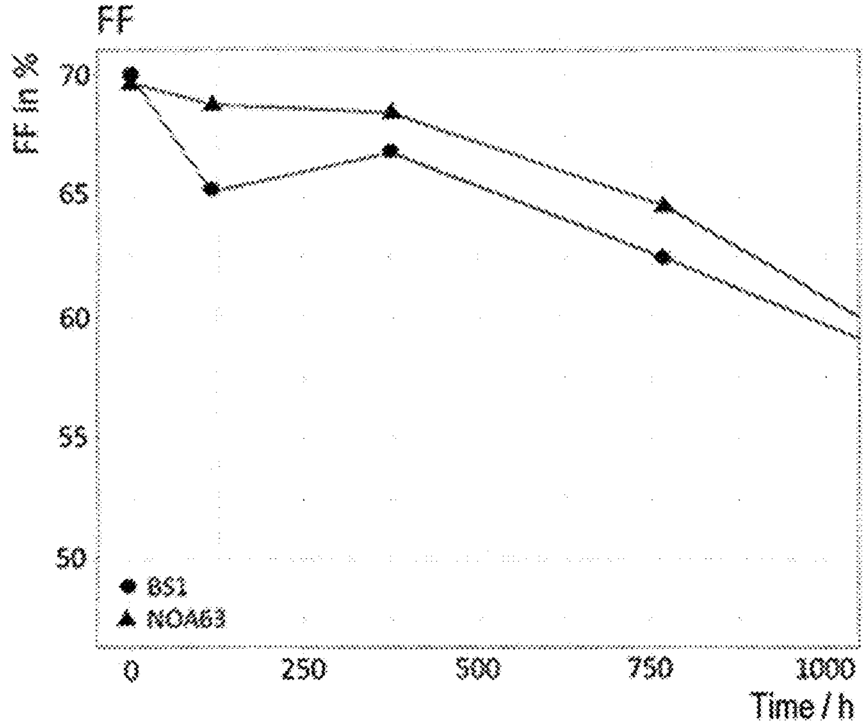
FIGS. 5*a*-5*d* illustrate experimental results of laser-structured photovoltaic elements with an inventive coating and a noninventive coating.
Figure 5B:
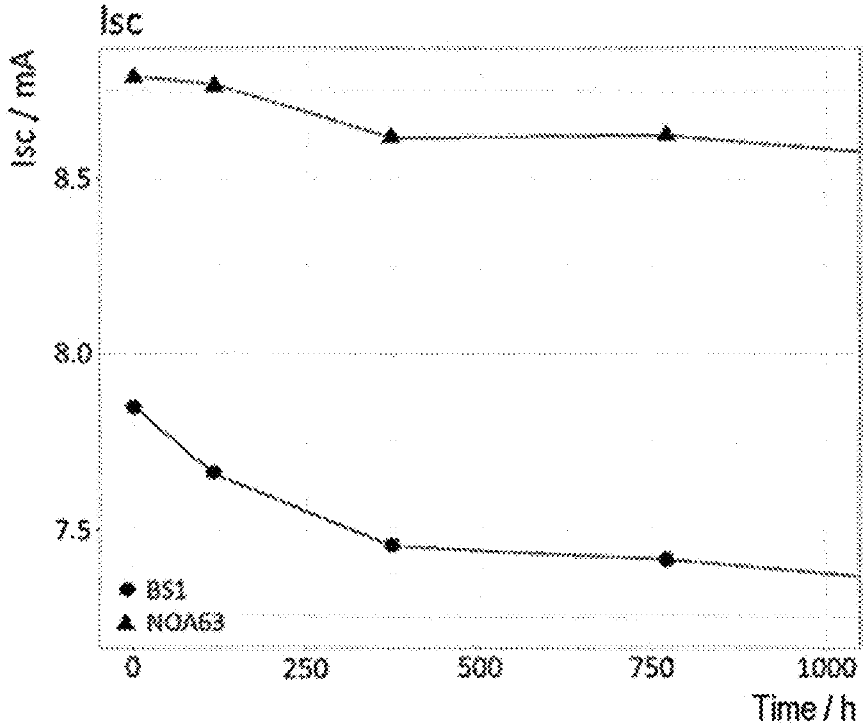
Figure 5C:
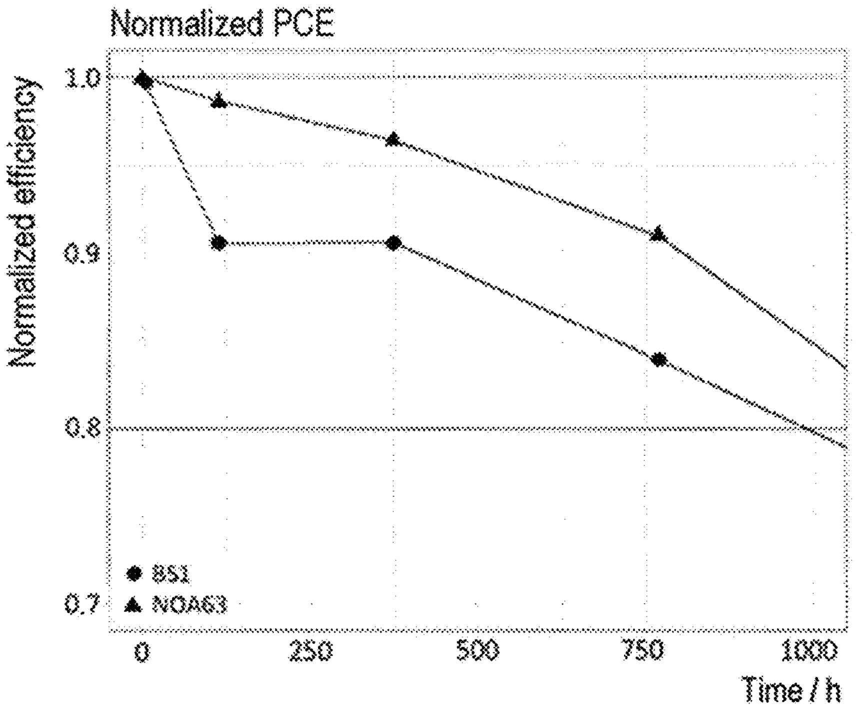
Figure 5D:
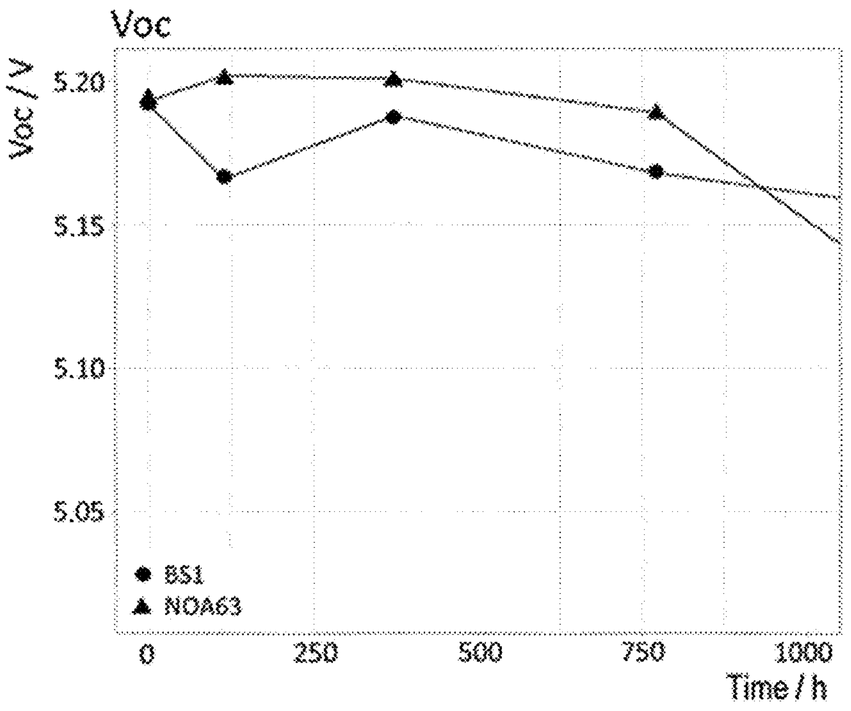

FIG. 5A shows the progression of the fill factor FF of the photovoltaic element over a period of 1000 h, FIG. 5B shows the progression of the short-circuit current Isc of the photovoltaic element over a period of 1000 h, FIG. 5C shows the progression of the normalized efficiency of the photovoltaic element PCE over a period of 1000 h, and FIG. 5D shows the progression of the open-circuit voltage Voc of the photovoltaic element over a period of 1000 h, each by comparison of an inventive coating 10 of NOA63 as winding protection with a noninventive coating with BS1 as winding protection.

It can be inferred from FIGS. 5A to 5D that the fill factor FF, the short-circuit current Isc, the normalized efficiency PCE, and the open-circuit voltage Voc of the photovoltaic element with an inventive coating 10 as winding protection have a largely better progression over a period of 1000 h compared to the photovoltaic element with BS1 as winding protection. This affords better protection of the photovoltaic element with the inventive coating 10 as winding protection, in particular of the layer system 7 of the photovoltaic element.

Figure 6A:
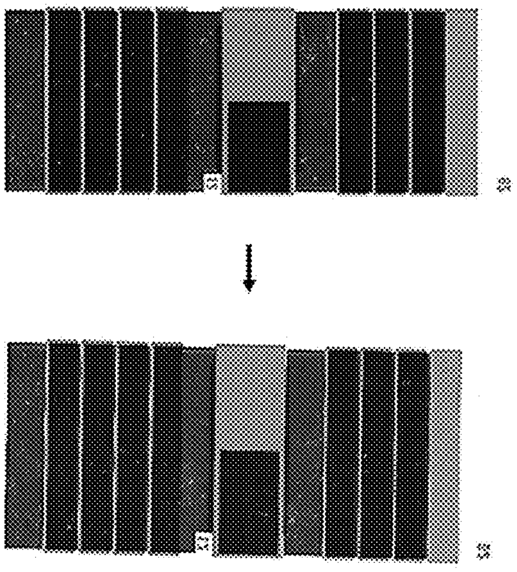
FIGS. 6*a*-6*b* illustrate, in one working example, an influence of the monomers of an inventive coating and a noninventive coating on the photoactive layer of a layer system.
Figure 6B:
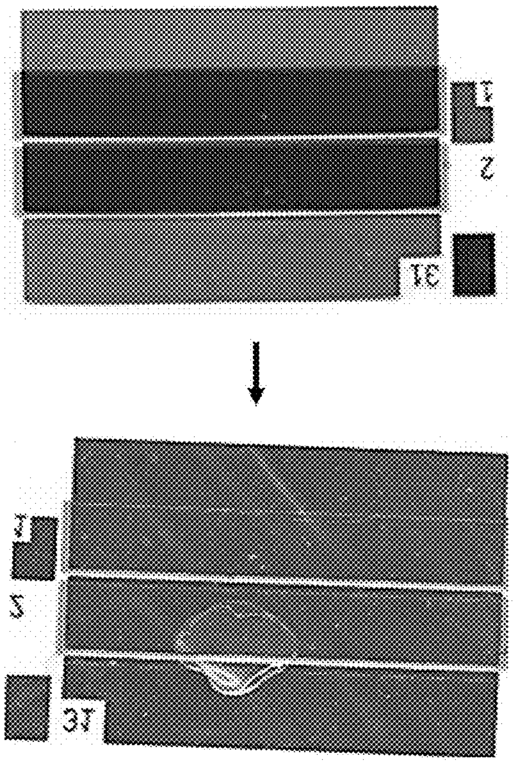

FIG. 6 shows, in a working example, an influence of the monomers of an inventive coating 10 and a noninventive coating on the photoactive layer 4 of a layer system 7.

In this working example, the optoelectronic component 100 is an organic photovoltaic element. The organic photovoltaic element has a substrate 1, for example of glass, on which there is an electrode 2 comprising ITO, for example. Disposed thereon is a layer system 7 with an electron-transporting layer 3 and at least one photoactive layer 4, with at least one absorber, a p-conducting donor material, and a n-conducting acceptor material, e.g. C60 fullerene. Disposed on that are a p-doped hole transport layer 5, and an electrode 6 of aluminum.

For assessment of the compatibility of the coating 10, in particular of the monomer mixture of the invention comprising at least one first monomer and a second monomer for formation of the coating 10, with a layer system 7, the monomer mixture was applied in droplet form to the layer system 7 of an optoelectronic component 100 and then distributed over the area. The optoelectronic component 100 has a laser-structured layer system 7. In this working example, the first monomer and the second monomer were mixed in a quantitative ratio of 55:45 to 57:43. The first monomer and the second monomer are the main constituents of the monomer mixture and together make up a proportion of at least 80% by weight, based on the total weight of the monomer mixture. The influence of the inventive coating 10, in particular of the inventive monomer mixture for forming the coating 10, comprising at least one first monomer and one second monomer for forming the coating 10 (FIG. 6A), was examined by comparison with a noninventive mixture of monomers for forming a coating (FIG. 6B) for optoelectronic components 100. The monomer mixture of the invention includes NOA63, and the noninventive mixture VE672 includes acrylates, in particular 25-75% exo-1,7,7-trimethylbicyclo[2.2.1]hept-2-yl acrylate, 25-75% methacrylic esters, and 2.5-10% urethane acrylate. The coatings were each produced from a liquid monomer mixture with subsequent curing by UV irradiation.

No discoloration, cloudiness or any other visual change in the layer system 7 is apparent in the inventive coating 10 (FIG. 6A); the laser-structured layer system 7 is undamaged. By contrast, the noninventive monomer mixture discolors the layer system 7 (FIG. 6B), and partly dissolves it; the laser-structured layer system 7 is distinctly damaged. Discoloration of the layer system 7 is apparent even through the electrode.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and

The invention claimed is:

1. An optoelectronic component having a coating for planarization and stabilization of a laser-structured surface of the optoelectronic component, wherein the optoelectronic component is a photovoltaic element, and wherein the optoelectronic component is a flexible optoelectronic component, the optoelectronic component having a layer system comprising a first electrode, a second electrode, and at least one photoactive layer, wherein the at least one photoactive layer is disposed at least partly between the electrodes, and wherein the layer system is laser-structured, the coating comprising:

a polythiolene matrix, wherein the polythiolene matrix is formed by polymerization from at least one first monomer and one second monomer, wherein:

the first monomer is a polyfunctional thiol having at least three thiol groups $R^1$—SH, the second monomer is a polyfunctional alkene having at least two C—C double bonds

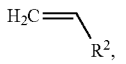

and wherein the coating is disposed on the optoelectronic component and has at least partial direct contact with the layer system for at least the first monomer and/or the second monomer.

2. The optoelectronic component as claimed in claim 1, wherein the first monomer has at least four thiol groups, and wherein the thiol groups are preferably each at a terminal end.

3. The optoelectronic component as claimed in claim 1, wherein the second monomer has at least three C—C double bonds, and wherein the C—C double bonds are at a terminal end.

4. The optoelectronic component as claimed in claim 1, wherein the polythiolene matrix is additionally formed from at least one third monomer and/or at least one further component, wherein the at least one third monomer has at least two thiol groups, wherein the thiol groups are each at a terminal end, and wherein the at least one further component is selected from the group consisting of an additive, a flame retardant, a filler, an inhibitor, an initiator, and a stabilizer.

5. The optoelectronic component as claimed in claim 1, wherein the first monomer is a mercapto ester, the first monomer being selected from the group consisting of:

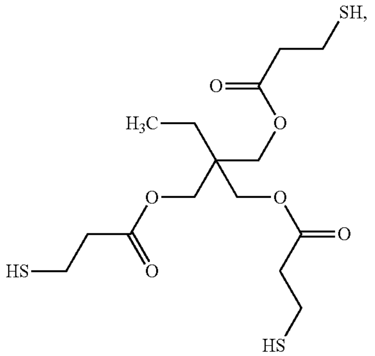

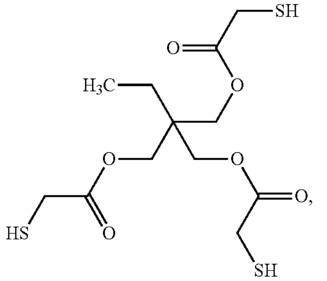

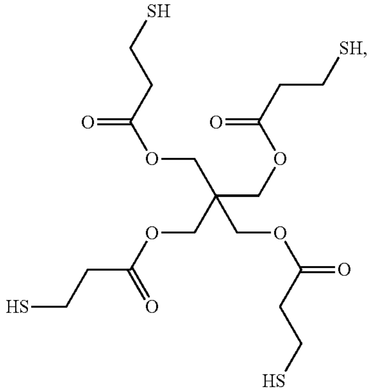

and

-continued

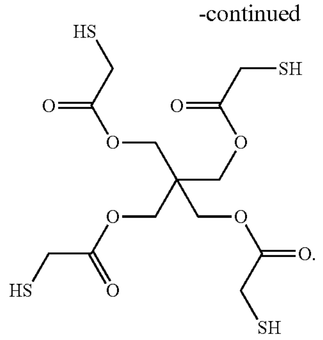

6. The optoelectronic component as claimed in claim 1, wherein the C—C double bonds are allyl groups and/or vinyl groups, and wherein the second monomer is a triallyl isocyanurate or a triallyl cyanurate selected from the group consisting of:

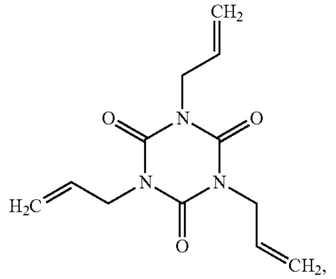

and

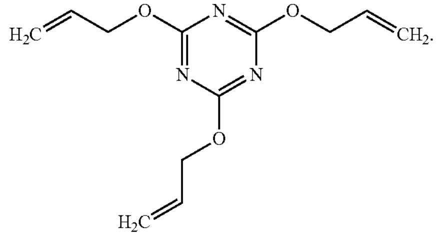

7. The optoelectronic component as claimed in claim 1, wherein the molar ratio of the first monomer to the second monomer is 2:1 to 1:0.9.

8. The optoelectronic component as claimed in claim 1, wherein the coating is flexible, and wherein an elasticity of the coating, is 80,000 psi to 360,000 psi, and/or a layer thickness of the coating is 1 μm to 2000 μm.

9. The optoelectronic component as claimed in claim 1, the coating configured as winding protection for an optoelectronic component and/or for a semifinished product for production of an optoelectronic component, wherein the coating protects the optoelectronic component and/or the layer system of the optoelectronic component and/or of the semifinished product, at least temporarily from outside influences, such that damage is prevented.

10. A method of coating a surface of a laser-structured optoelectronic component with a coating as claimed in claim 1, comprising:

providing an optoelectronic component with a layer system having a first electrode, a second electrode, and at least one photoactive layer disposed between the first and second electrodes, wherein the optoelectronic component is laser-structured, providing at least one first monomer and one second monomer, wherein the first monomer is a polyfunctional thiol having at least three thiol groups, and the second monomer is a polyfunctional alkene having at least two C—C double bonds, mixing the at least first monomer and second monomer to obtain a monomer mixture, wherein the viscosity of the monomer mixture is 200 mPas to 9000 mPas, applying the monomer mixture to the optoelectronic component, wherein the first monomer and/or the second monomer has at least partial direct contact with the layer system and/or has diffusion contact with the layer system, and curing the monomer mixture by polymerizing to form the coating, wherein the laser-structured surface of the layer system is planarized and stabilized, such that the layer system is not damaged.

11. The method as claimed in claim 10, wherein the monomer mixture is cured by UV curing, dual curing, thermal curing, and/or a reaction gas.

12. The method as claimed in claim 10, wherein the method is conducted in a roll-to-roll method.

13. The method as claimed in claim 10, wherein the monomer mixture is applied by a screenprinting method, a plotting method, an inkjet printing method, a 3D printing method, a slot die method, a comma bar method, or a rakel method, and wherein a pressure for application of the monomer mixture is less than 200 kPa.

* * * * *